(12) United States Patent
Ruile et al.

(10) Patent No.: US 7,262,676 B2
(45) Date of Patent: Aug. 28, 2007

(54) ELECTROACOUSTIC COMPONENT AND METHOD FOR THE PRODUCTION THEREOF

(75) Inventors: Werner Ruile, München (DE); Ulrike Rösler, Herbertshausen (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 11/294,077

(22) Filed: Dec. 5, 2005

(65) Prior Publication Data
US 2006/0076852 A1  Apr. 13, 2006

Related U.S. Application Data

(63) Continuation of application No. PCT/EP04/04177, filed on Apr. 20, 2004.

(30) Foreign Application Priority Data
Jun. 4, 2003  (DE) .................. 103 25 281

(51) Int. Cl.
*H03H 9/64* (2006.01)
(52) U.S. Cl. .................. 333/193; 333/195; 333/150
(58) Field of Classification Search .................. 333/193
See application file for complete search history.

(56) References Cited
U.S. PATENT DOCUMENTS

| | | |
|---|---|---|
| 3,983,514 A | 9/1976 | Coussot |
| 4,328,472 A | 5/1982 | Grudkowski |
| 6,046,656 A | 4/2000 | Mishima |
| 6,445,265 B1 * | 9/2002 | Wright .................. 333/193 |

FOREIGN PATENT DOCUMENTS

| | | |
|---|---|---|
| FR | 2216654 | 9/1975 |
| JP | 10-335974 | * 12/1998 |
| WO | 03/088475 A1 | 10/2003 |

OTHER PUBLICATIONS

Toshio Irino et al.: "Propagation of Boundary Acoustic Waves Along a ZnO Layer between Two Material", IEEE Transaction on Ultrasonics, Ferroelectrics, and Frequency Control, vol. 35, No. 6, Nov. 1988, pp. 701-707.
Yukio Ito et al.: "High-Frequency Ultrasonic Transducer Arrays Using ZnO Thin Films", 1993 Ultrasonics Symposium, pp. 1117-1125.
Japanese Patent Abstract No. 10335974, dated Dec. 18, 1998 to Yoshihiro.

* cited by examiner

*Primary Examiner*—Barbara Summons
(74) *Attorney, Agent, or Firm*—Mayback & Hoffman, P.A.; Gregory L. Mayback; Scott D. Smiley

(57) ABSTRACT

An electroacoustic component including a layer system disposed between two substrates and electroacoustic structures for exciting a guided bulk acoustic wave, the electroacoustic structures being devoid of cavities. The layer system includes a piezo-electric layer, at least one metal layer, and a planarizing layer, which includes a planar interface provided with a substrate disposed directly thereabove. Such a component can be produced at a low cost by direct wafer bonding of two wafers. The electroacoustic component structures are electrically connected to the external contacts through perpendicular electrical connections.

35 Claims, 6 Drawing Sheets

ELECTROACOUSTIC COMPONENT AND METHOD FOR THE PRODUCTION THEREOF

CROSS-REFERENCE TO RELATED APPLICATIONS

This is a continuing application, under 35 U.S.C. § 120, of copending international application No. PCT/EP2004/004177, filed Apr. 20, 2004, which designated the United States; this application also claims the priority, under 35 U.S.C. § 119, of German patent application No. 103 25 281.9, filed Jun. 4, 2003; the prior applications are herewith incorporated by reference in their entirety.

BACKGROUND OF THE INVENTION

Field of the Invention

The invention relates to an electroacoustic component, in particular, a band-pass filter for high-frequency connections.

Such a component includes at least one piezo-electric layer and at least two electrodes connected with the layer and disposed on different potentials for exciting an electroacoustic wave. The electrodes can be disposed on opposite surfaces of the piezo-electric layer and serve the purpose of exciting an acoustic bulk wave, the expansion direction of which corresponds to the perpendicular axis. This effect is used, for example, in thin-layer resonators.

An acoustic surface wave can be excited between two electrodes disposed on different potentials, which each include electrode fingers. The electrode fingers of the first electrode and of the second electrode engage one another and form an electroacoustic transducer. When the acoustic surface wave arrives on the electrode fingers, the acoustic surface wave expands in the lateral plane and, in turn, induces an electric current in the electrodes.

Resonators, Double Mode Surface Acoustic Wave filters (also referred to as DMS-filters), broad-banded fan filters, and further components that operate with acoustic surface waves, for example, are known.

Commonly, a cavity is provided above the electroacoustic transducer so that the surface wave can expand. The active regions (in view of the excitation of the acoustic bulk wave) of thin-layer resonators can be disposed on a carrier substrate above a cavity. There is a further possibility of disposing an acoustic mirror between the carrier substrate and the thin-layer resonator to prevent the drain of energy of the bulk wave into the substrate. In either case, the effort connected with procuring or sealing the cavities or the formation of the acoustic mirrors is high.

The document by Furukawa et al. titled "Piezo-electric Boundary and Surface Waves Propagating on Glass Film/ZnO Film/Glass Substrate Structures," IEICE Transaction, Vol. E 74, No. 8, 1991, pp. 2184-2187, examines electroacoustic boundary waves or bulk waves that can be expanded in a lateral direction in the volume of a ZnO-layer and that is disposed between two glass layers (contrary to a bulk wave in a thin-layer resonator). Due to the fact that the expansion speed of the wave in the middle layer is smaller than in the outer glass layers, the expansion of the bulk wave parallel to the boundary waves of the piezo-electric layer is possible. These characteristics or configuration of three agents principally corresponds to the basic structure of a common waveguide. The configuration has the advantage that cavities are not necessary for the expansion of the acoustic wave. However, the Furukawa document does not describe how to excite the bulk wave or how to embody a component that operates with acoustic waves of this type and that can be used particularly for processing a high-frequency signal. Instead, the lateral bulk wave can expand in the described layer system in any direction in the lateral plane, because the path for exciting and targeted guiding of the wave (for example, by configuring the electrodes) is not indicated.

A component that operates with boundary waves is disclosed in U.S. Pat. No. 6,046,656 to Mishima. The component includes a piezo-electric layer that serves as a first substrate, electrode structures disposed thereon, a planarizing layer applied thereabove, and a second substrate disposed on the planarizing layer that is connected with the remainder of the construction by a direct wafer bonding method at a temperature of between 100° C. and 1000° C. Due to the fact that the piezo-electric layer is provided as a first substrate or carrier substrate, this component is not suitable for generating and guiding the lateral modes of acoustic bulk waves.

Lateral modes of acoustic bulk waves are also disclosed in International Publication WO 01/06647, corresponding to U.S. Pat. Nos. 6,788,170 and 6,812,619 to Kaitila et al., are mostly considered to be modes that disturb and that need to be suppressed. Also known are applications, where the lateral modes of the bulk waves are used for the acoustic coupling of two thin-layer resonators, which are disposed tightly next to each other. However, the guiding of a lateral mode of the bulk wave in a certain direction is not supported by any devices provided for this purpose.

SUMMARY OF THE INVENTION

It is accordingly an object of the invention to provide an electroacoustic component and method for the production thereof that overcome the hereinafore-mentioned disadvantages of the heretofore-known devices and methods of this general type and that provides an electroacoustic component that operates with bulk acoustic waves in piezo-electric thin layers and is devoid of cavities above electroacoustically active regions or acoustic mirrors.

With the foregoing and other objects in view, there is provided, in accordance with the invention, an electroacoustic component, including a first substrate, a layer system disposed at the first substrate to define a first interface therebetween, the layer system having a piezo-electric layer, a first metal layer disposed on the piezo-electric layer, the first metal layer having electrode structures and contact surfaces, the electrode structures being disposed next to one another and forming a functional unit, a region of the piezo-electric layer disposed adjacent the functional unit forming an active region in which a guided bulk acoustic wave of a wavelength $\lambda$ can propagate, and a dielectric planarizing layer, and a second substrate, the piezo-electric layer being disposed between the first substrate and the first metal layer, the first metal layer being disposed between the piezo-electric layer and the dielectric planarizing layer, and the dielectric planarizing layer being disposed between the first metal layer and the second substrate, the layer system and the second substrate defining a second interface therebetween, the piezo-electric layer and the first and second substrates being formed to have a smaller propagation velocity of the guided bulk acoustic wave in the piezo-electric layer than a propagation velocity of the guided bulk acoustic wave in the first and second substrates, and the layer system and the first and second interfaces being devoid of cavities.

With the objects of the invention in view, there is also provided an electroacoustic component, including a first substrate, a layer system disposed at the first substrate to define a first interface therebetween, the layer system having a piezo-electric layer, a first metal layer disposed at the piezo-electric layer opposite the first substrate, the first metal layer having electrode structures and contact surfaces, the electrode structures being disposed next to one another and forming a functional unit, a region of the piezo-electric layer disposed adjacent the functional unit forming an active region in which a guided bulk acoustic wave of a wavelength $\lambda$ is expanded, a dielectric planarizing layer disposed at the first metal layer at least on a side of the first metal layer opposite the piezo-electric layer, and a second substrate disposed at a side of the dielectric planarizing layer opposite the first metal layer, the layer system and the second substrate defining a second interface, the piezo-electric layer and the first and second substrates being formed to have a smaller expansion speed of the guided bulk acoustic wave in the piezo-electric layer than an expansion speed of the bulk wave in the first and second substrates, and the layer system and the first and second interfaces being devoid of cavities.

The present invention discloses an electroacoustic component that includes a first substrate with a (electroacoustic) layer system disposed thereon.

The layer system includes a piezo-electric layer, on which a first metal layer is disposed. Electrode structures and contact surfaces are embodied (preferably, parallel to each other on periodic rasters) in the first metal layer, whereby the contact surfaces can be accessed externally with reference to their electrical connection with additional components. The accessibility of the contacts can be guaranteed, for example, by a through-contact (a preferred embodiment) or by an external wire connected with the contact surface. A dielectric planarizing layer is disposed on the first metal layer and a second substrate is disposed above the planarizing layer. Towards the second substrate, the planarizing layer has a planar surface, covers the electrode structures, and tightly seals regions covered by the electrode structures externally with the piezo-electric layer.

The electrode structures of the first metal layer that are disposed next to each other, preferably, periodically or according to a pattern suitable for the directed deflection of the acoustic wave, form a functional unit (for example, the functional unit of an electroacoustic transducer) for guiding an acoustic wave (hereinafter referred to as a guided bulk acoustic wave or GBAW) in a lateral plane. Regions of the piezo-electric layer that are each disposed continuously and below such a functional unit, each form an active region, in which a guided bulk acoustic wave of the wavelength $\lambda$ can be excited or expanded. A plurality of functional units electrically connected with one another and a corresponding number of active regions are, preferably, provided in the component according to the invention. Thereby, the active regions can be coupled acoustically with one another or acoustically decoupled from one another other.

The layer system as well as the boundary area between the layer system and the respective substrate is void of cavities. The expansion speeds of the guided bulk acoustic wave in the piezo-electric layer are chosen to be smaller than the expansion speed of the guided bulk acoustic wave in the first and second substrate. The first and second substrate and the piezo-electric layer disposed therebetween thus form a waveguide, whereby the piezo-electric layer forms the core region, or the two substrates form the jacket region of the waveguide.

In accordance with another feature of the invention, preferably, the piezo-electric layer is of ZnO, AlN, $LiNiO_3$, or $LiTaO_3$.

In accordance with a further feature of the invention, there is provided a second metal layer between the first substrate and the piezo-electric layer, the second metal layer having an electrode disposed below or adjacent the active region in a continuous manner with respect to the active region, and the electrode structures and the electrode of the second metal layer exciting the guided bulk acoustic wave perpendicular to the piezo-electric layer.

In accordance with an added feature of the invention, the electrode structures of the first metal layer form at least one of an electroacoustic transducer and a resonator.

In accordance with an additional feature of the invention, an upper interface of a layer disposed directly below the piezo-electric layer is roughened outside of regions that are disposed directly below the active region or an interface surface of a layer disposed adjacent the piezo-electric layer is roughened outside of regions disposed adjacent the active region.

In accordance with yet another feature of the invention, metal structures are embodied outside of the regions in the second metal layer to increase roughness of an interface to the piezo-electric layer.

In accordance with yet a further feature of the invention, the upper interface of the layer disposed directly below the piezo-electric layer is roughened only in regions directly below the contact surfaces or in supply lines embodied in the first metal layer.

In accordance with yet an added feature of the invention, the interface surface of the layer disposed adjacent the piezo-electric layer is roughened only in regions directly adjacent the contact surfaces or in supply lines embodied in the first metal layer.

In accordance with yet an additional feature of the invention, the first substrate has a bottom side, the second substrate has a top side, external contacts are disposed on at least one of the bottom side of the first substrate and the top side of the second substrate, and through-contacts electrically conductively connect the contact surfaces with the external contacts through at least one of the first and second substrates.

In accordance with again another feature of the invention, the first substrate has a first side, the second substrate has a second side, external contacts are disposed on at least one of the first side and the second side, and through-contacts electrically conductively connect the contact surfaces with the external contacts through at least one of the first and second substrates.

In accordance with again a further feature of the invention, at least one of the first and second metal layers having a trimming region therewithin, a number $\geq 1$ of trimming structures being capacitively coupled with the at least one of the electroacoustic transducer and the resonator and being embodied in the trimming region, and the trimming region being exposed through at least one of the first and second substrates or the trimming region to be accessed by a laser beam through at least one of the first and second substrates.

In accordance with again an added feature of the invention, at least two of the through-contacts in a respective one of the first and second substrates extend in a V-shaped cross-section perpendicular to a respective plane of one of the first and second substrates, cut through corresponding ones of the contact surfaces, and end above an interface of a respective other one of the first and second substrates facing the respective one of the first and second substrates, and the V-shaped through-contacts are trench-shaped and extend along a length thereof.

In accordance with again an additional feature of the invention, the first substrate has a bottom side, the second substrate has a top side, a large-surface metal layer metallizes at least one of the top side and the bottom side, and the V-shaped through-contacts are disposed in the large-surface metal layer and electrically connect the large-surface metal layer with the contact surfaces.

In accordance with still another feature of the invention, the large-surface metal layer is on one of the top side of the second substrate and the bottom side of the first substrate and the external contacts are embodied in a respective other one of the first and second substrates.

In accordance with still a further feature of the invention, the first substrate has a first side, the second substrate has a second side, a large-surface metal layer metallizes at least one of the first and second sides, and the V-shaped through-contacts are disposed in the large-surface metal layer and electrically connect the large-surface metal layer with the contact surfaces.

In accordance with still an added feature of the invention, the large-surface metal layer is on one of the first and second sides and the external contacts are embodied in a respective other one of the first and second substrates.

In accordance with still an additional feature of the invention, the large-surface metal layer is connected to ground.

In accordance with another feature of the invention, at least one of the through-contacts in the first substrate is connected through a corresponding one of the contact surfaces to at least one of the through-contacts in the second substrate.

In accordance with a further feature of the invention, there are provided at least two functional circuits electrically connected with one another and at least partially embodied in the first metal layer, the at least two functional circuits each being embodied in one of functional zones, at least one of the V-shaped through-contacts being electrically connected with the large-surface metal layer and with ground, and at least two of the functional zones being at least one of electrically and acoustically decoupled from one another in a lateral plane.

In accordance with an added feature of the invention, one of the functional zones includes at least a portion of a transmission filter and another of the functional zones separated therefrom includes at least a portion of a receiving filter.

In accordance with an additional feature of the invention, there is provided further perpendicular electrical connections and at least one of the first and second substrates including a semiconductor layer having in a volume thereof integrated component structures electrically connected with at least one of the contact surfaces and the external contacts through one of the through-contacts and the further perpendicular electrical connections.

In accordance with yet another feature of the invention, the dielectric planarizing layer contacts the piezo-electric layer In accordance with yet a further feature of the invention, the piezo-electric layer has a thickness of between $0.1\lambda$ and $\lambda$. If the layer thickness is much smaller than $0.1\lambda$, the dispersion of the GBAW is disadvantageously large and the electroacoustic coupling is too low. If the layer thicknesses substantially exceed the value of $\lambda$, it is possible that further modes of acoustic waves can be excited, which remove the energy from the active region and which can, thus, contribute to an increase of the insertion attenuation of the component.

The layer system is formed by those layers, in which a large portion of the energy of the GBAW is concentrated (whereby the maximum of the energy distribution lies in a perpendicular direction in the piezo-electric layer). The thickness of the respective substrate is chosen in accordance with the penetration depth of the GBAW such that the GBAW sufficiently fades out towards the outside so that an additional increase of the substrate thickness or the addition (externally) of further layers cannot influence the characteristics of the GBAW. The thickness of the first or of the second substrate, respectively, is chosen to be between $2\lambda$ and $5\lambda$, preferably.

In accordance with yet an added feature of the invention, the total thickness of the layer system is between $\lambda$ and $2\lambda$.

The electroacoustic component according to the invention has the advantage that, as compared with the known components, it has smaller dimensions and can be produced in a cost-efficient Direct Wafer Bonding (DWB) method, because the procurement of the cavities or acoustic mirrors is not necessary. Due to the fact that only small layer thicknesses are required, the time requirement for separating such layers is correspondingly low.

A housing in the common sense is not necessary, because the deflection of the material in the respective substrate, caused by the GBAW, fades out towards the outside, because of the relatively large thickness of the substrates in the substrate volume.

In accordance with yet an additional feature of the invention, the invention is based on the idea to dispose the electrode structures (electrode fingers connected to a common bus bar) on a periodic raster or in a configuration for deflecting the acoustic wave, preferably, in one direction so that, in the volume therebelow (active regions) of the piezo-electric layer, a guided bulk acoustic wave (GBAW) can be generated or guided in a lateral direction, respectively, that, preferably, expands perpendicularly to the electrode fingers. Basically, GBAW represents a guided lateral mode of a guided bulk acoustic wave (BAW=Bulk Acoustic Wave) and differs from a BAW in that it expands in a lateral direction predetermined by the electrode structure, in which a constructive overlapping of locally excited wave components takes place. GBAW differs from a Surface Acoustic Wave (SAW) in that it is not a surface acoustic wave, but a bulk wave that expands along the interface of the piezo-electric layer. The periodic electrode structure thereby serves to guide the bulk wave.

One can conclude from Furukawa et al. that, during the construction of a corresponding component, the external glass layers must have a minimum thickness (sufficient for fading out the excited wave in the volume of the glass layers), which is at least 10 µm for a HF component that is configured for 1 or 2 GHz, for example.

Due to the fact that the glass layers border on the piezo-electric layer, and because a large portion of the energy of the acoustic wave (in total up to 50%) is concentrated in these layers, the acoustic characteristics of the entire layer system are influenced strongly by the composition and quality of the glass layers. The two glass layers (particularly in view of the mass production of the components and also because supplementary trimming of the component is complicated for the reasons stated below) must be reproducible to a large extent, which, in principle, can be achieved by a low deposition speed in a deposition method, but at a correspondingly high expenditure of time.

It is unclear, thereby, how a layer stack containing two layers of required quality with a thickness in the region of, for example, between 10 and 100 μm and a highly-textured piezo-electric layer can be produced in a cost-efficient method.

A second aspect of the present invention is the production method of the above-mentioned electroacoustic component by direct wafer bonding.

With the objects of the invention in view, there is also provided a method for producing a layer system for the electroacoustic component of the present invention, including the steps of providing a wafer as the first substrate, applying a layer system on the first substrate, applying a piezo-electric layer, a metal layer, and a dielectric layer on the first substrate in the corresponding sequence to construct the layer system, planarizing the exposed surface of the dielectric layer, providing a second wafer as the second substrate, and connecting the first and second wafers with one another by direct wafer bonding method and thereby forming a compound configuration.

With the objects of the invention in view, there is also provided a method for producing an electroacoustic component, including the steps of forming a layer system by applying a first metal layer on a piezo-electric layer, the first metal layer having electrode structures and contact surfaces, the electrode structures being disposed next to one another and forming a functional unit, the application of the first metal layer thereby forming an active region in which a guided bulk acoustic wave of a wavelength λ is expanded in a region of the piezo-electric layer below the functional unit, applying a dielectric layer on the first metal layer to produce an exposed surface of the dielectric layer, and planarizing the exposed surface of the dielectric layer. The layer system is applied on a first wafer and a second wafer is applied on the exposed surface of the dielectric layer to define a first interface between the layer system and the first substrate and a second interface between the layer system and the second substrate, the layer system and the first and second interfaces being devoid of cavities. The piezo-electric layer and the first and second wafers are formed to have a smaller expansion speed of the guided bulk acoustic wave in the piezo-electric layer than an expansion speed of the guided bulk acoustic wave in the first and second wafers. The first and second wafers are connected with one another by direct wafer bonding to thereby form a compound configuration.

In accordance with again another mode of the invention, the first metal layer is first applied on the piezo-electric layer and, then, the dielectric layer is applied on the first metal layer, and the layer system is first applied on the first wafer and, then, the second wafer is applied on the layer system.

In accordance with again an added mode of the invention, V-shaped through-contacts are provided at the compound configuration, functional regions for a plurality of components are embodied in the first wafer, and the plurality of components are singled by sawing through the compound configuration along the V-shaped through-contacts.

In accordance with again an additional mode of the invention, the structure of at least one layer of the layer system is externally changed with a laser beam.

In accordance with still another mode of the invention, at least one layer of the layer system is structured with at least one laser and the material of the at least one layer is networked or oxidized with the laser.

Initially, a first wafer representing a first substrate (carrier substrate) is provided. A layer system is applied on the first substrate. In corresponding sequence, a piezo-electric layer, a metal layer, and a dielectric layer are applied on the first substrate for the purpose of constructing the layer system, whereby the exposed surface of the dielectric layer facing upward is planarized by chemical mechanical polishing, for example, so that a planarizing layer is formed. A second wafer including a second substrate is provided. The first and the second wafer are, now, connected with one another by a direct wafer bonding method (preferably, in a "cold" method, i.e., <100° C.).

Preferably, the dielectric layer (for example, of silicon oxide) is deposited at low temperatures (for example, at room temperature).

In accordance with again a further mode of the invention, the direct wafer bonding is carried out at a temperature of <100° C.

In accordance with still a further feature of the invention, the periodically disposed electrode structures are connected to a common bus bar and form a comb-like electrode. The electrode structures of an electrode and the electrode structures in a further electrode can engage so that the electrode structures disposed on different potentials are disposed alternatingly. For example, two engaging electrodes form an electroacoustic transducer. A plurality of fingers disposed next to each other that lie on the same potential can form reflectors.

In wave expansion direction, the transducer can be divided into a plurality of regions, whereby a plurality of electrode structures disposed next to each other form excitation cells or reflection cells, for example.

In accordance with still an added feature of the invention, the center-to-center distance of fingers having an exciting effect on the acoustic wave, being disposed next to one another, and lying on different potentials is half a wavelength, whereby the fingers, preferably, have a width of a quarter wavelength. In a reflection cell, the fingers can have a width or center-to-center distance that differs therefrom.

In accordance with still an additional feature of the invention, the excitation cells and the reflection cells can be disposed alternatingly, whereby the deflection of the guided bulk acoustic wave in a preferred direction can be achieved by a corresponding known configuration of the cells.

The piezo-electric layer can have the characteristics of a Natural Single Phase Uni-Directional Transducer (NSPUDT) substrate, whereby the deflection of the guided bulk acoustic wave in a preferred direction can be achieved by natural characteristics of the piezo-electric substrate.

The efficiency of the electroacoustic transformation in an electroacoustic component depends on the electroacoustic coupling, which, in turn, depends on the orientation of the piezo-electric axis to the excitation directions. The maximum electroacoustic coupling is achieved when the excitation of the acoustic wave takes place along the piezo-electric axis. Generally, the piezo-electric axis of the piezo-electric layer is directed perpendicularly to the lateral plane. Therefore, one variant of the present invention proposes to dispose a second metal layer between the first substrate and the piezo-electric layer, in which metal layer at least one electrode is embodied for the excitation of the guided bulk acoustic wave in a perpendicular direction. The electrode of the second metal layer lies in the perpendicular direction, opposite the electrode structures of the first metal layer, is disposed below the corresponding active region, and is, preferably, embodied in a continuous manner. The GBAW is excited perpendicularly between the electrode structures of the first and the second electrode of the second metal layer and expands laterally.

However, it is also possible to structure the electrode of the second metal layer, whereby electrode structures (electrode fingers) are embodied. Another possibility is to do without the structuring of the second metal layer so that the electrode of the second metal layer is disposed below the active region or the active regions, as well as below the supply lines and contact surfaces of the component. However, in doing so, it should be noted that an undesired excitation of the acoustic waves between the contact surfaces of the first metal layer and their opposite regions of the second metal layer does not occur.

For example, the undesired excitation of an acoustic wave (particularly below the contact surfaces and supply lines of the component, which have a relatively large surface and are, thus, subject to parasitic capacitive couplings with conductive or semiconductive structures of the surrounding) can be overcome in that the structure or the texture of the piezo-electric layer in the corresponding regions is changed such that the expansion of acoustic waves is prevented in these regions. For example, it is also possible to roughen the layer that serves as support during the growing of the piezo-electric layer in the corresponding regions. This prevents the formation of a mono-crystalline structure with the predetermined orientation of the piezo-electric axis during the growing of the piezo-electric layer. Instead, piezo-electric poly-crystals, whose entire piezo-electric axes do not have a preferred direction, are formed in such regions, which is why the piezo-electric coupling is destroyed.

For example, it is possible to structure the second metal layer outside of active regions (particularly below the contact surfaces and the supply lines) such that the structures generated thereby are randomly distributed and/or are substantially smaller than the wavelength of the acoustic wave.

It is possible to also embody externally accessible contact surfaces in the second metal layer.

In accordance with another feature of the invention, a first functional intermediate layer can be disposed between the first substrate and the piezo-electric layer. A second functional intermediate layer can be disposed between the second substrate and the planarizing layer. Then, the two intermediate layers form the external layers of the layer system and can each be used for equalizing the difference in the thermal expansion coefficient of the respective substrate and the closest layer of the layer system.

In accordance with a further feature of the invention, the first and/or second intermediate layer can be of $SiO_x$, where $1.9 \leq x \leq 2.1$, which, preferably, has an index of refraction of between 1.43 and 1.49 (this region is characteristic for a highly-textured silicon oxide layer). After the healing of the component, a silicon oxide so structured has low intrinsic voltages and, thus, a low damping of the acoustic wave, as well as advantageous elastic characteristics (in view of the expansion speed of the BAW). Furthermore, silicon oxide has the advantage that, contrary to most other materials, it has a negative temperature coefficient (TCF) and, in combination with a layer of a material with a TCF>0 (here, periodic layer) ensures a lower TCF (for example, less than 25 ppm/K) of the compound configuration (i.e., of the layer system).

In accordance with an added feature of the invention, it is advantageous if the expansion speed of the GBAW in the respective intermediate layer is smaller than in the (first or second) substrate that borders on this intermediate layer. To increase the electroacoustic coupling in the layer system, it is advantageous, if the expansion speed of the GBAW in the respective intermediate layer is higher than that in the piezo-electric layer.

In accordance with an additional feature of the invention, the planarizing layer can also be of silicon oxide or $SiO_x$ with the characteristics outlined above.

In accordance with yet another feature of the invention, the first and/or the second substrate can, for example, be of a material chosen from glass, semiconductor (for example, Si), or piezo-electric.

The layer system can have a functional intermediate layer facing the respective substrate, the layer being chosen from a magnetically tunable material (for example, a material having the Giant-Delta-E effect). If the substrate directly connected with this layer has piezo-electric characteristics, it can be used for introducing an acoustical stress in the layer system and, thus, change the frequency of the component.

The dielectric layer (which later forms the planarizing layer) and the intermediate layers can, for example, be generated by Chemical Vapor Deposition (CVD) methods or Physical Vapor Deposition (PVD) methods.

In accordance with yet a further feature of the invention, the first and/or the second metal layer is substantially of Al, Cu, Mo, Ti, W, Ta, Cr, or an alloy that includes these components. It is also possible that the metal layers each are of a plurality of layers, whereby at least one of the layers is of one of these materials. The metal layers can each border on a functional intermediate layer (for example an oxide or metal oxide layer), which is embodied as passivation layer. The passivation layer can be of a large-surface configuration or at least partially include only the structures of the respective metal layer.

Generally, it is possible that the layers of the layer system cited herein each have a multi-layer construction made of suitable materials.

An embodiment of the invention proposes to embody the electroacoustic component such that the characteristics (particularly the texture) of at least one of the layers of the layer system can be changed through the first or second substrate. The layers of the layer system can be externally accessible, for example, with a suitable choice of material of the first or second substrate for a laser beam (if, for example, the corresponding substrate is transparent in the optical region). The laser beam can trigger an oxidation or a lattice-like polymerization of one of the interior layers (for layers made of plastic) through the substrate, for example. Particular elastic parameters, which are relevant for the guiding of the GBAW of the concerned material, can thereby be changed.

On one hand, the wavelength of the GBAW that can expand in a transducer according to the invention is determined by the periodicity of the electrode fingers, as is the case with a SAW, and, on the other hand, by the thickness of the piezo-electric layer, as is the case with a BAW.

With common electroacoustic components with cavities above the acoustically active component structures, the production tolerance and the corresponding frequency shift of the component can be corrected by trimming, whereby the thickness of a layer provided as trimming layer, for example, is changed accordingly. Such a trimming, however, is not possible in a component without cavities (for example, after connecting two wafers during the production of a component according to the invention) because the layer region relevant for the expansion of the GBAW is "buried" between the substrates and, thus, removed from external access, which, for the above reasons, is desired by the invention.

The relative production tolerance of this layer thickness is comparatively high, due to the relatively small thickness of the piezo-electric layer that lies in the magnitude of a wavelength. On the other hand, a large dispersion (frequency dependency of the expansion speed of the GBAW)

and, thus, a correspondingly large production-related frequency accuracy of the component is to be expected with a particularly small layer thickness of the piezo-electric layer, even with slight variations of the layer thickness.

To equalize the above-mentioned production tolerance, a variant of the invention proposes to expose certain regions of the layer system (trimming regions) to enable particularly the trimming of the component after connection of all of the components (first substrate, layer system, second substrate). A further transducer (second transducer) that is electrically connected with a trimming structure can be disposed, for example, between a reflector and the transducer (first transducer). Preferably, the trimming structure, which differs from the above-described construction (transducer—further transducer—reflector) is embodied as a transducer and represents a capacitance or, for the second transducer, a load that is capacitively coupled to the first transducer through the transducer connected therewith. The capacitance or the load impedance of the trimming structure is large, corresponding to the number of its electrode fingers engaging in one another.

The reflection characteristics of the total construction and, thus, the frequency of the GBAW can be influenced by the change of the load impedance of the transducer of the trimming structure (for example, by separating a number of electrode fingers of the trimming structure by lasers).

In accordance with yet an added feature of the invention, the trimming of the component takes place on the wafer plane (i.e., prior to the sawing of the base plate or of the singling of the component) and can be carried out after planarizing the dielectric layer or after combining two wafers to one large-surface base plate.

In accordance with yet an additional feature of the invention, the trimming structure is sealed hermetically after the trimming to prevent environmental influences or a further change of the trimming structure, in that a sealing layer is applied at least on the trimming region (or also on the entire exposed surface of the component, with the exception of the regions provided as external contacts).

In addition to electrical characteristics, electroacoustic characteristics of the component can principally also be adjusted by the trimming whereby the interior layers of the stack are subject to modification. Preferably, such modifications are made in those layers, where a substantial portion of the energy of the GBAW is concentrated, i.e., in the layers of the layer system.

In accordance with again another feature of the invention, the external contacts of the component are embodied on the exposed surface of the first and/or of the second substrate. The external contacts are connected with the contact surfaces in an electrically conducting manner, for example, through through-contacts through the first and/or the second substrate.

In accordance with again a further feature of the invention, the through-contacts represent metallized openings in the corresponding substrate. Preferably, these openings are embodied after the connection of the first and the second wafer, and are metallized subsequently.

The provision of the external contacts on the top side or bottom side of the component (which seems difficult for electroacoustic components with cavities and does not make much sense due to the considerable height of such a component) has the advantage that a modular construction of a plurality of components is also possible on top one another.

In accordance with again an added feature of the invention, at least one of the through-contacts embodied in the first substrate can be connected to at least one of the through-contacts embodied in the second substrate through the corresponding contact surface.

In accordance with again an additional feature of the invention, it is proposed to embody at least two of the through-contacts in the respective substrate perpendicular to the substrate plane in a V-shaped manner in cross-section, whereby the corresponding contact surfaces are cut through. Preferably, the V-shaped through-contact ends above or below the interface of the respective other substrate and represents an obstacle for the expansion of the GBAW, which can be used for the decoupling of two different functional regions of the component (for example, transmission filter and receiving filter of a duplexer).

Principally, any electrically connected functional circuits of the component that are at least partly embodied in the first metal layer, which are each embodied in a functional zone, can be acoustically and/or electrically shielded from one another in the lateral plane by a continuous V-shaped through-contact. The V-shaped through-contact is, thereby, electrically connected with the large-surface metal layer and with ground and separates the said functional zones from one another in the region of the layer system, but without entirely cutting through the two substrates.

In accordance with still another feature of the invention, either the top side of the second substrate or the bottom side of the first substrate can be metallized by a large-surface metal layer that is electrically connected with the contact surfaces (or ground) provided for such a purpose by the V-shaped through-contacts.

In accordance with still a further feature of the invention, the large-surface metal layer can, for example, be disposed on the top side of the second substrate, whereby the external contacts are embodied in the first substrate and the V-shaped through-contacts that are electrically connected with the large-surface metal layer are embodied in the second substrate.

Alternatively, the large-surface metal layer can be disposed on the bottom side of the first substrate, whereby the external contacts are embodied in the second substrate and the V-shaped through-contacts that are electrically connected with the large-surface metal layer are embodied in the first substrate.

The V-shaped through-contacts are created by V-shaped sawing of the total layer construction and subsequent metallization of the thus-created cuts.

The V-shaped through-contacts can also serve for the singling and the sealing of the components embodied in the compound configuration that is created by the combination of the first and the second wafer. The components can be singled, for example, by sawing along V-shaped through-contacts.

In such a case, preferably, the V-shaped through-contacts are embodied continuously along the saw lines so that the metallization applied therein ensures a hermetic sealing of the component.

In accordance with a concomitant feature of the invention, at least one of the substrates can include a semiconductor layer (particularly, an Si-layer), in the volume of which integrated component structures are embodied that are electrically connected with the contact surfaces and/or the external contacts of the component by the through-contacts or further perpendicular electrical connections.

Other features that are considered as characteristic for the invention are set forth in the appended claims.

Although the invention is illustrated and described herein as embodied in an electroacoustic component and method for the production thereof, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
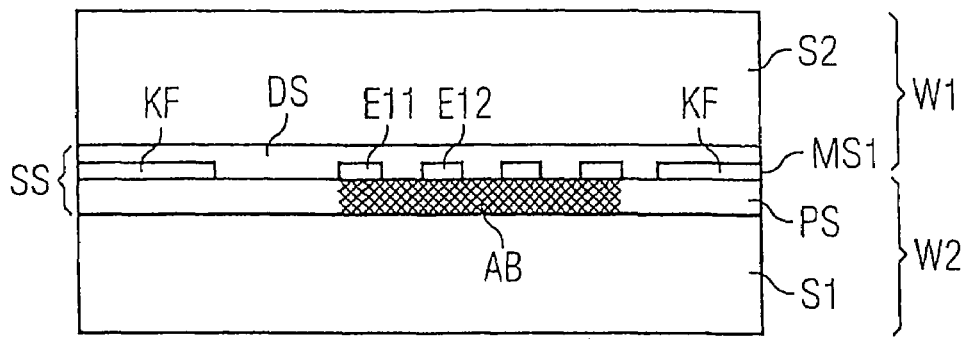
FIG. 1 is a fragmentary, diagrammatic cross-sectional view of a layer construction of a component according to the invention.

Referring now to the figures of the drawings in detail and first, particularly to FIG. 1 thereof, there is shown a first variant of a component according to the invention in schematic cross-section. The component includes a first substrate S1, a second substrate S2, and a layer system SS disposed therebetween. The layer system SS includes a piezo-electric layer PS, a first metal layer MS1 disposed thereon, and a dielectric layer disposed above the first metal layer that forms a planarizing layer DS. In the metal layer MS1, contact surfaces KF and electrode structures E11 and E12 are embodied that each represent, for example, electrode fingers of a first and a second electrode E1 or E1', respectively (according to FIG. 3B).

Preferably, the piezo-electric layer is of ZnO or AlN.

Preferably, the first and second substrates S1, S2 are of silicon. The substrates can also be, for example, of glass, $SiO_2$, ZnO, $LiNbO_3$, $LiTaO_3$, or can include at least one layer of the materials cited here.

Preferably, the planarizing layer DS is of silicon oxide. The contact surfaces KF serve the purpose of contacting the component.

The layer system and the two substrates form an acoustic waveguide, in which the GBAW can be excited and expanded.

The electrode structures E11, E12 that, preferably, are disposed periodically and alternatingly form, for example, an electroacoustic transducer or reflector. The guided bulk acoustic wave is excited between the electrode structures E11 and E12 that are disposed on different potentials. The guided bulk acoustic wave expands in the lateral plane in a region of the piezo-electric layer that is characterized as active region AB. This region is represented in FIG. 1 by hatching.

Preferably, the thickness of the first and the second substrate is chosen such that the deflection of the atoms in the respective substrate caused by the GBAW sufficiently fades out externally (towards the free surface of the substrate). The fact that the GBAW fades out towards free surfaces of the component has the advantage that the electroacoustic characteristics of the acoustic waveguide are not influenced by the change in the surroundings, particularly, by the application of further layers (for example, a deflection layer or a grouting).

In a DWB-method, the component can be produced by connecting a first wafer W1 with a second wafer W2, whereby the first substrate S1 together with the layer system SS forms the first wafer W1, or the second substrate S2 forms the second wafer W2, respectively. Pluralities of components that are singled from one another in a later method step, are, thereby, provided for each wafer.

All of the layers of the component are deposited on each other in a common deposition method, whereby the quality of the layer placed underneath also determines the quality of the subsequent layer.

Contrary thereto, the DWB-method for connecting two wafers has the advantage that highly reproducible (monocrystalline) layers can be formed in the respective wafer.

Temperatures of above 100° C. have been used with previously known DWB-methods, whereby, if necessary, lattice mismatch strains that can impair the acoustic characteristics of the waveguide (particularly in view of the reproducibility of the component) occur at the interface of two wafers. In a variant of a DWB-method according to the invention, the wafers can also be bonded at lower temperatures <100° C. (or at room temperature).

Figure 12A:
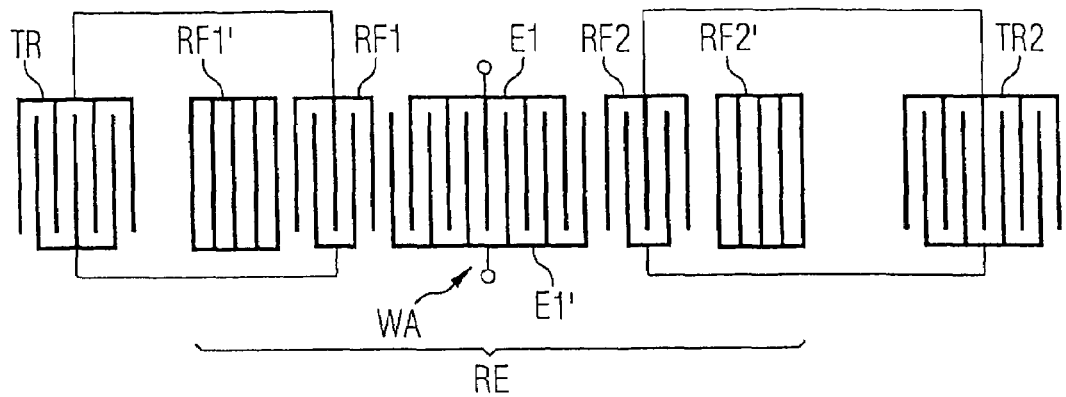
FIG. 12A is a fragmentary, diagrammatic plan view of a transducer used in a component according to the invention and that is capacitively coupled with trimming structures.
Figure 12B:
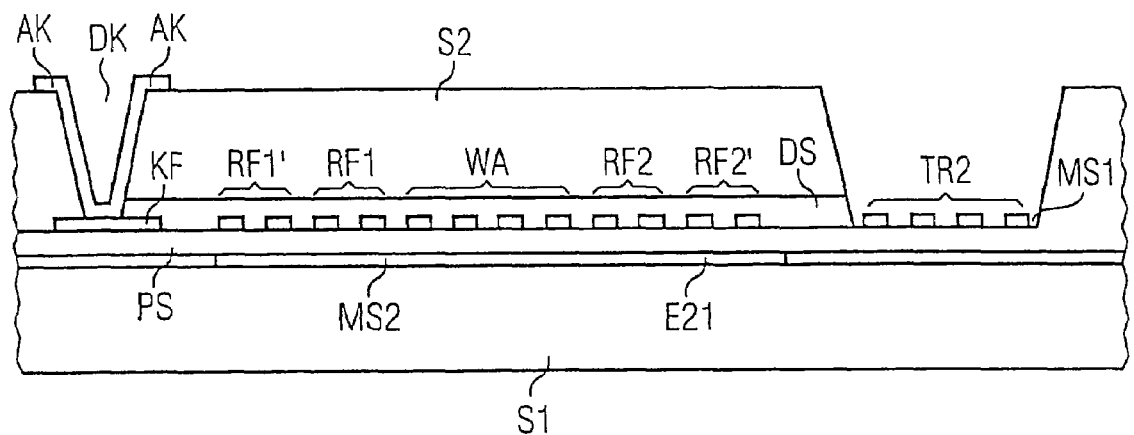
FIG. 12B is a fragmentary, diagrammatic cross-sectional view of a component according to the invention with the trimming structures of FIG. 12A.

The dielectric layer that is applied on the first metal layer must be planarized prior to the connection of the wafers. Thus, the wafer on the planarized side becomes thin. Under such circumstances, the layer thickness of the planarizing layer cannot be adjusted in a particularly exact manner and cannot be changed after the connection of the wafers (for example, for trimming the component). The present invention, thus, proposes an alternative trimming method as illustrated in FIGS. 12A, 12B.

Figure 2:
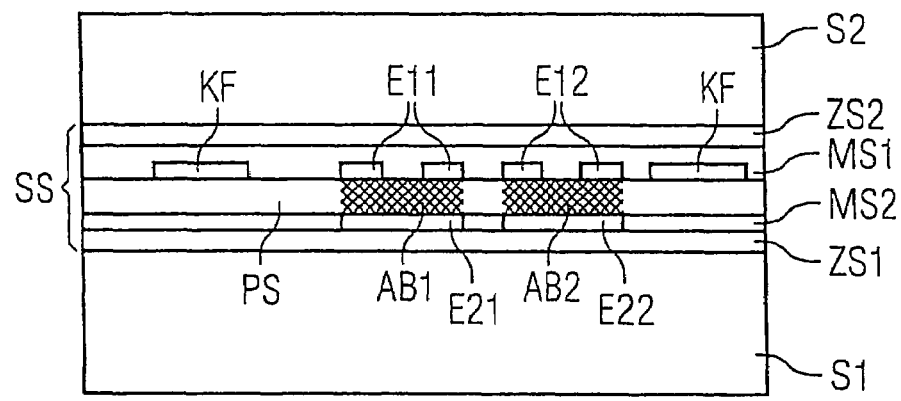
FIG. 2 is fragmentary, diagrammatic cross-sectional view of an embodiment of the component according to the invention with two metal layers and functional intermediate layers.

FIG. 2 shows a further variant of a component according to the invention. In this further variant, the layer system contains a second (structured) metal layer MS2 that is disposed between the piezo-electric layer PS and a first intermediate layer ZS1. The first intermediate layer ZS1 is disposed between the second metal layer MS2 and the first substrate S1.

A second functional intermediate layer ZS2 is disposed between the planarizing layer DS and the second substrate S2. In the second metal layer MS2, electrodes E21 and E22 are embodied that are each located opposite the electrode structures E11 or E12, respectively, of the first metal layer MS1 and that are embodied in a continuous manner below these electrode structures (which together form a transducer, for example).

The region of the piezo-electric layer PS that lies between the electrode structures E11 and the electrode E21, forms a first active region AB1 (for example, the active region of a first transducer), in which the guided bulk acoustic wave can expand. Analogously, the electrode structures E12 and the electrode E22 disposed on the opposite side thereof, form a second active region AB2 (for example, the active region of a second transducer) together with the corresponding region of the piezo-electric layer PS.

Preferably, the first and the second functional intermediate layers ZS1 or ZS2, respectively, are the external layers of the layer system SS. The intermediate layers ZS1, ZS2 serve, for example, for reducing the temperature coefficients of the entire layer system or fulfill a different function. The intermediate layers ZS1, ZS2 can each have a multi-layer construction of different functional partial layers.

The electric excitation of the GBAW between the electrode of the first and the electrode of the second metal layer, i.e., perpendicular to the surface of the piezo-electric layer, has the advantage that the GBAW is excited along the piezo-electric axis that is mostly directed normal to the layer surface. Due to the better electroacoustic coupling, a larger bandwidth of a component embodied as bandpass filter can be achieved.

The invention achieves a highly-textured piezo-electric layer in the active regions that are provided for the expansion of the GBAW. Structure disturbances of the piezo-electric layers are achieved outside of active regions, particularly below relatively large-surface contact surfaces and supply lines. The structure disturbances are created during the growing of a layer on a rough support. In the exemplary embodiment introduced in FIG. 4, the first functional intermediate layer ZS1 serves as growth layer for the piezo-electric layer. The regions of the intermediate layer ZS1 opposite the contact surfaces KF are roughened.

The first or the second substrate can be structured for exposing the contact surfaces, for example, by etching. Furthermore, there is the possibility of structuring the respective substrate with semiconducting characteristics such that semiconductor component structures are embodied in the volume of the substrate (3D-integration). The semiconductor component structures are connected with the contact surfaces and with electroacoustically active component structures through the through-contacts DK or additional perpendicular electric connections. (See, i.e., FIG. 6).

Figure 3A:
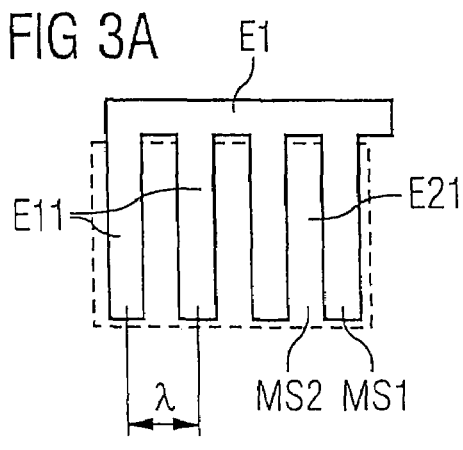
FIG. 3A is a fragmentary, diagrammatic plan view of an exemplary configuration of electrode structures of first and second metal layers of the component according to FIG. 2.

FIG. 3A illustrates an exemplary configuration of the electrode structures E11 of the first metal layer MS1 and of the electrode E21 of the second metal layer MS2 in a component according to the present invention. The electrode structures E11 are connected to a common bus bar and, together, form a first electrode E1 of the first metal layer MS1. The electrode structures E11 of the electrode E1 are disposed opposite the electrode E21 of the second metal layer. The electrode structures E11 are disposed on a periodic raster, the periodicity of which is an entire wavelength $\lambda$, for example (whereby the phases of each of the wave components locally excited at each of the electrode fingers E11 correspond so that the wave components constructively overlap).

The electrode structures E11 and the electrode E21, together with the piezo-electric layer disposed therebetween, form an electroacoustic transducer. If the configuration introduced in FIG. 3A has the periodicity of the electrode structures $\lambda/2$, instead of $\lambda$, the configuration works in a reflecting manner for the GBAW.

Figure 3B:
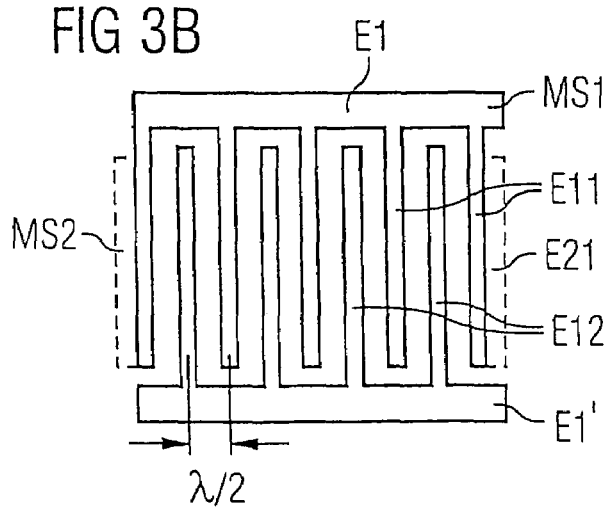
FIG. 3B is a fragmentary, diagrammatic plan view of another exemplary configuration of electrode structures of first and second metal layers of the component according to FIG. 2.

FIG. 3B is a further possible configuration of the electrode structures E11, E12 of the first metal layer MS1 and of the electrode E21 of the second metal layer MS2 in a component according to the invention. In this embodiment, two electrodes E1 and E1', whose electrode structures or finger structures, respectively, engage and which, preferably, are alternatingly disposed on a periodic raster, are embodied in the first metal layer MS1. The center-to-center distance of the electrode fingers of two electrode structures E11 or E12, respectively, is $\lambda/2$. Thereby, the first electrode E1 of the first metal layer MS1 has electrode structures E11. The second electrode E1' of the first metal layer MS1 has electrode structures E12. On one hand, the bulk acoustic wave is excited between the electrode E21 of the second metal layer MS2 and, on the other hand, between the electrode structures E11, E12 of the first metal layer MS1, whereby the strongest excitation comes about in those regions where the electrode finger of the first metal layer lies directly opposite the electrode of the second metal layer.

The electrode structures of the first and the second electrode of the first metal layer create the conditions for a constructive interference of the locally excited wave components in both preferred directions (in the figure towards the left and the right) perpendicular to the electrode fingers. The electrode structures of the first metal layer MS1, thus, serve the purpose of mainly keeping the energy of the excited lateral mode of a bulk acoustic wave in an active region.

In this variant of the present invention, a transducer is formed by the interdigitally disposed electrodes E1 and E1', the piezo-electric layer PS disposed therebelow, and the electrode E21 of the second metal layer, which serves the purpose of exciting the GBAW. The electrodes of the different metal layers disposed opposite one another thereby serve as excitation electrodes and the electrodes of the first metal layer serve as guide electrodes for the purpose of guiding of GBAW.

A transducer or resonator according to the invention can be disposed in a signal line or parallel thereto (for example, against ground). The electrodes of the electrode pairs of the first metal layer MS1 (E1 and E1') that serve the purpose of the directed guiding of the GBAW can be electrically connected with two "hot" terminals, while the excitation electrode E21 of the second metal layer MS2 disposed opposite thereto is connected to ground. It is also possible to connect the electrodes E1 to ground, for example, and to connect the electrodes E1' and E21, respectively, to a "hot" terminal.

Figure 4:
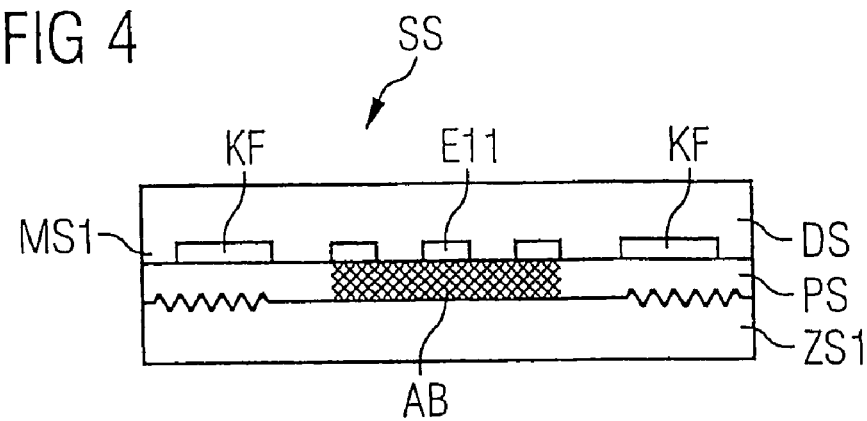
FIG. 4 is a fragmentary, diagrammatic cross-sectional view of a layer system according to the invention with partially roughened regions of an intermediate layer located directly below a piezo-electric layer disposed below contact surfaces.

The layer system SS of a component according to the invention is shown in FIG. 4. In this variant of the present invention, the piezo-electric layer PS is grown on the first functional intermediate layer ZS1, which serves as support during the growing of the piezo-electric layer. The regions of the surface of the first intermediate layer ZS1 that are disposed opposite to the contact surfaces KF and supply lines of the component (for example, bus bars of the electrodes) are roughened, which is why the formation of a highly-textured piezo-electric layer directly above these regions is prevented. In a preferred exemplary embodiment, all regions of the upper interface of the first intermediate layer ZS1 that are not disposed directly below the active region AB, are roughened. Thereby, a highly textured piezo-electric layer PS is achieved exclusively in the active regions AB so that the energy of the guided bulk acoustic wave is mainly concentrated in this region.

Figure 5A:
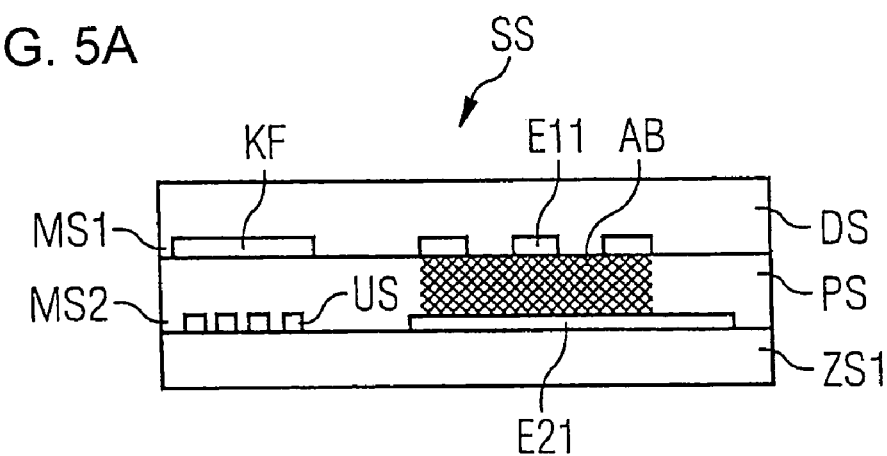
FIG. 5A is a fragmentary, diagrammatic cross-sectional view of a layer system according to the invention with regions of the second metal layer disposed below the contact surfaces structured for increasing roughness of an interface to the piezo-electric layer.
Figure 5B:
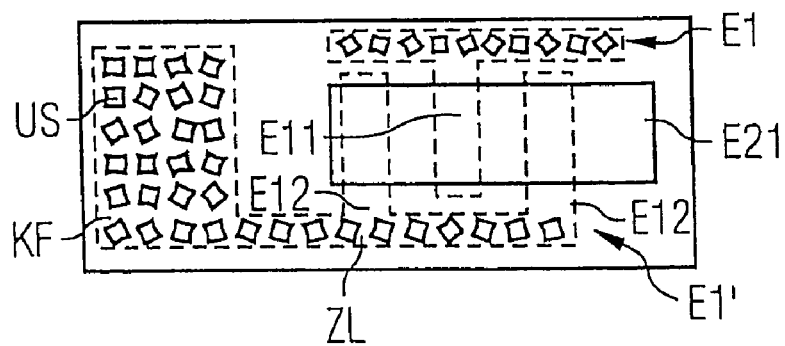
FIG. 5B is a fragmentary, diagrammatic plan view from below of the layer system according to the invention with regions of the second metal layer disposed below the contact surfaces structured for increasing roughness of the interface to the piezo-electric layer.

A further possibility of creating a highly-textured piezo-electric layer only in certain regions that are provided as active regions is introduced in FIGS. 5A and 5B. In this variant of the invention, the second metal layer MS2 serves as support during the growing of the piezo-electric layer PS. In the regions that are disposed directly opposite to the contact surfaces KF or supply lines ZL, the second metal layer MS2 is structured such that the growing of an orderly piezo-electric layer with a preferred direction of the piezo-electric axis is prevented by the thus-created unevenness of the support. The advantage of a support roughened in such a manner is that the roughness structures are created (photolithographically) in the same method step as the second metal layer MS2.

FIG. 5B illustrates a schematic view of the second metal layer MS2 from below (through the first intermediate layer ZS1). Randomly disposed interrupted metal structures US (small metal surfaces that each are not electrically connected with one another) are preferably disposed opposite to the contact surfaces KF of the first metal layer MS1. Preferably, such structures have measurements that are clearly below a wavelength. The interrupted metal structures US are furthermore disposed below the supply line ZL and the bus bars of the electrodes E1 and E1'.

Preferably, the large-surface electrode E21 of the second metal layer MS2 is disposed only in the region of a transducer, where the adjacent electrode fingers E11, E12 that are disposed on different potentials are disposed opposite one another in the direction of wave expansion (i.e., in the active region). The static capacitance of the transducer is, thereby, particularly low.

Figure 6:
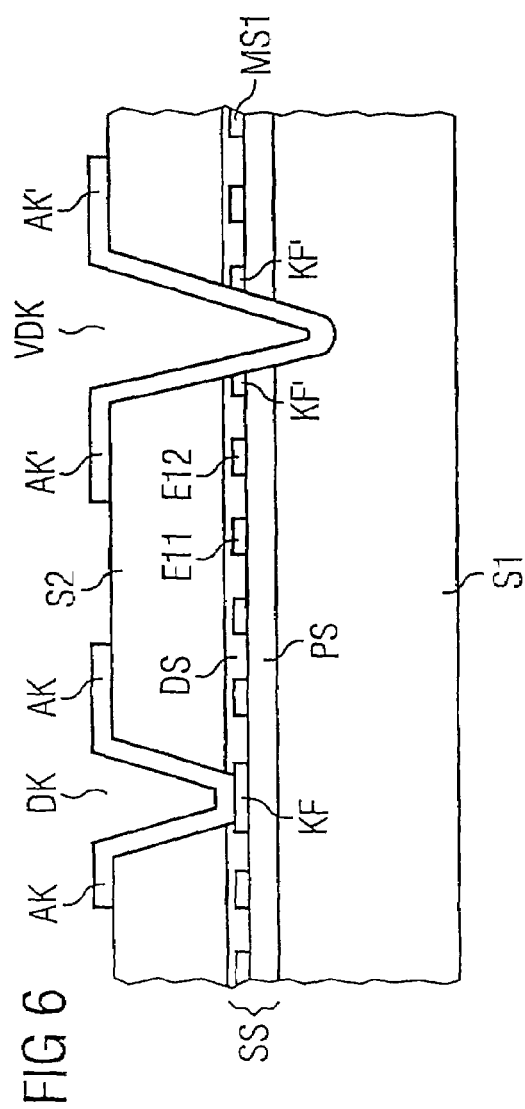
FIG. 6 is a fragmentary, diagrammatic cross-sectional view of an electroacoustic component according to the invention with through-contacts embodied in the second substrate and with V-shaped through-contacts.

FIG. 6 shows, in schematic cross-section, a portion of an electroacoustic component according to the invention with the through-contacts DK embodied in the second substrate S2 and with v-shaped through-contacts VDK. In the second substrate S2, the through-contacts DK can be generated, for example, by etching and subsequent metallization of the opening formed thereby. The through-contact DK represents a perpendicular electric connection between an external contact AK of the component that is disposed on the top side of the second substrate S2, and the contact surface KF. The V-shaped through-contact VDK connects the external contact AK' and the corresponding contact surface KF' in an electrically conducting manner.

The contact surface KF' is cut through by a wedge-shaped cut during the embodiment of the V-shaped through-contact VDK. The wedge-shaped cut is metallized to create the electric connection between the contact surface KF' and the external contact AK'. In the preferred embodiment, the V-shaped through-contact VDK completely cuts through the layer system SS to, thereby, also cut through the interface to the first substrate S1. The so formed V-shaped through-contact VDK (that goes through the first substrate and the layer system and partly into the second substrate) ensures a hermetic seal of the lateral external edges of the component along the saw lines, even after the singling of the component (along the V-shaped through-contact).

Figure 13:
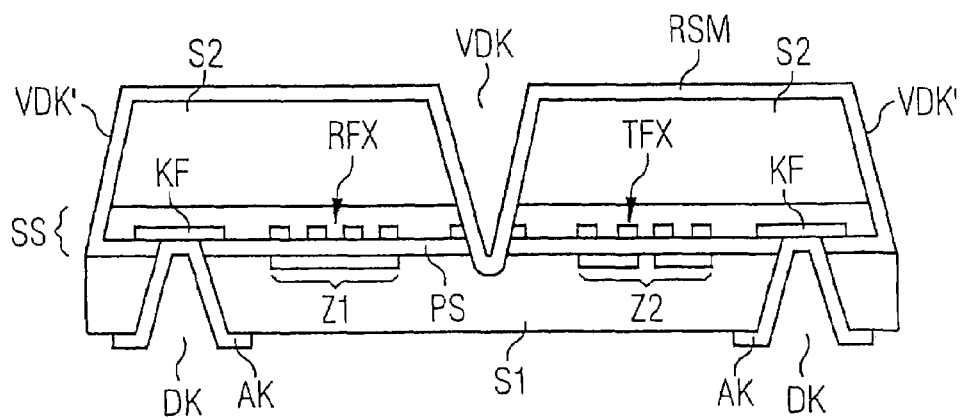
FIG. 13 is a fragmentary, diagrammatic cross-sectional view of a further component according to the invention with two functional regions shielded from one another by a V-shaped through-contact connected to ground.

A V-shaped through-contact can also serve as normal perpendicular electric connection between a contact surface and an external contact or for the purpose of electroacoustic decoupling or electric shielding of two regions of the component from one another (see, i.e., FIG. 13).

Figure 7:
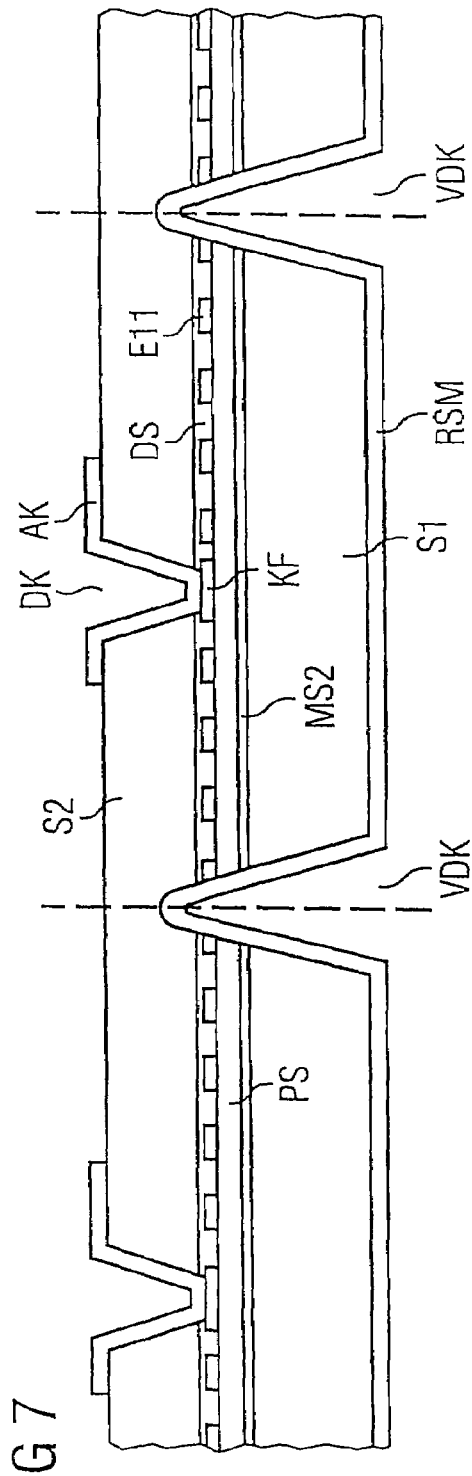
FIG. 7 is a fragmentary, diagrammatic cross-sectional view of a wafer with a plurality of not yet singled electroacoustic components according to the invention with the through-contacts and the V-shaped through-contacts embodied in respectively different substrates.

FIG. 7 introduces a large-surface compound configuration that includes a plurality of not yet singled components.

The singling of the components takes place along saw lines (see dashed lines) that correspond to the V-shaped through-contacts VDK. The V-shaped through-contacts VDK are, thereby, not embodied as individual holes, but trench-shaped and extended. In this exemplary embodiment, the second metal layer MS2 is electrically connected with the V-shaped through-contacts VDK, which, in turn, are electrically connected with a large-surface metal layer RMS (rear side metallization) and, for example, with ground. The large-surface metal layer RSM is applied on the exposed side of the first substrate S1. Preferably, the large-surface metal layer RSM and the metallization of the V-shaped through-contacts DK is generated in the same method step by sputtering, for example.

In this exemplary embodiment, the second metal layer MS2 is embodied as a non-structured layer. In this variant of the invention, the external contacts AK of the component are only provided on one side of the component.

Figure 8:
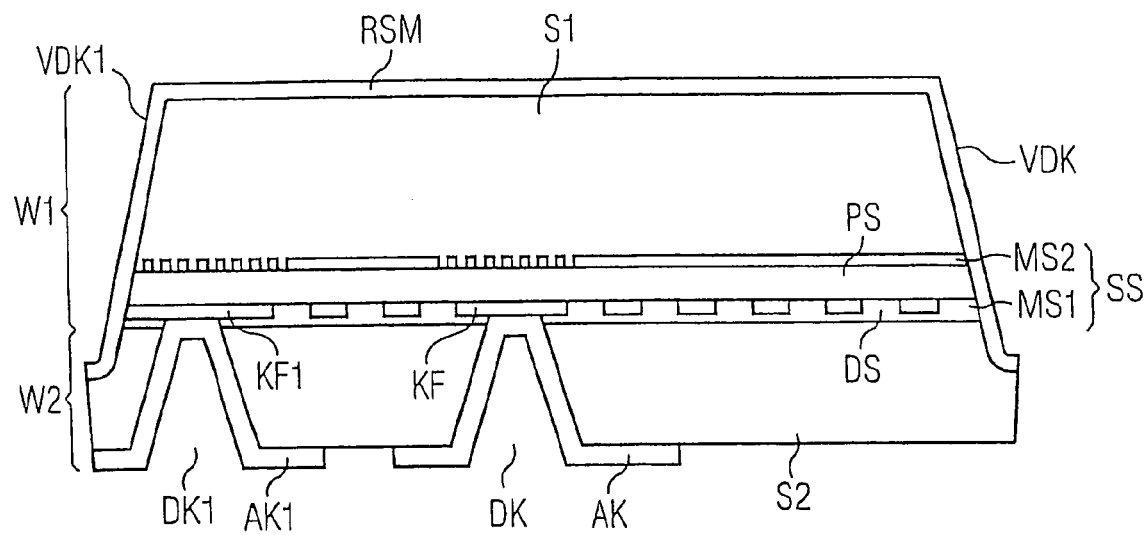
FIG. 8 is a fragmentary, diagrammatic cross-sectional view of a further component according to the invention with a structured second metal layer.

FIG. 8 shows an individual component along the v-shaped through-contacts VDK. The v-shaped through-contact VDK1 is connected in an electrically conducting manner with the through-contact DK1 embodied in the second substrate S2 through the contact surface KF1 and further with the external contact AK1. The external contact AK1 is thereby preferably provided with a ground connection of the component.

The second metal layer MS2 is structured according to FIG. 5. The v-shaped through-contacts VDK, VDK1 are electrically connected with the large-surface metal layer RSM (rear side metallization). The large-surface metal layer RSM is disposed on the bottom side of the first substrate S1 in this exemplary embodiment.

Figure 9:
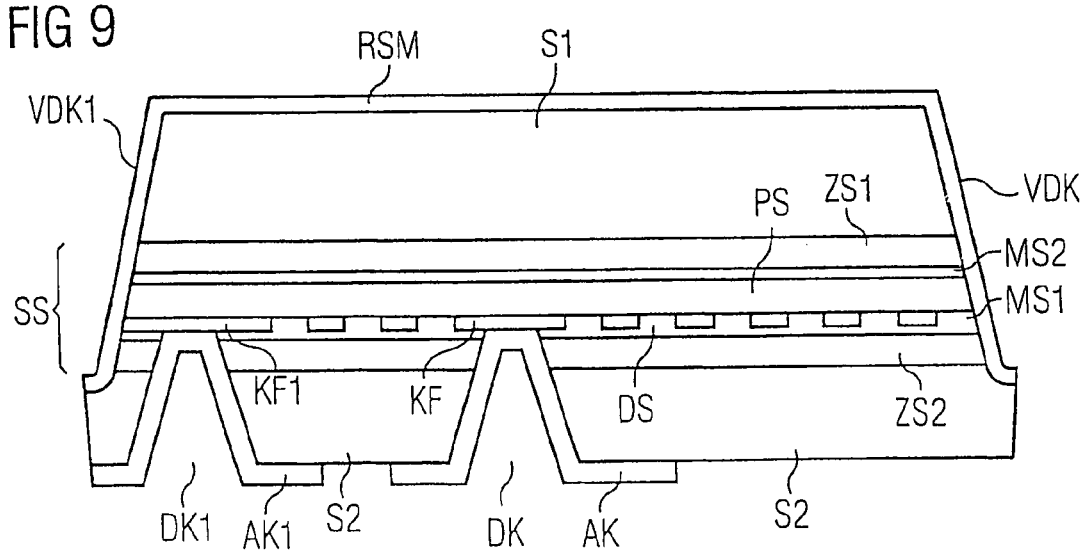
FIG. 9 is a fragmentary, diagrammatic cross-sectional view of a further component according to the invention with a continuous second metal layer connected with back side metallization.

FIG. 9 shows an exemplary embodiment of an electroacoustic component according to the invention with the functional intermediate layers ZS1 and ZS2. In this exemplary embodiment, the through-contacts DK, DK1 that each are electrically connected with the external contacts of the component AK, AK1, are embodied to extend through the second substrate S2, the second intermediate layer ZS2, and the planarizing layer DS and arrive on the respective contact surface KF or KF1, respectively. The external contacts of the component AK, AK1 are embodied on the exposed surface of the second substrate S2. The exposed surface of the first substrate S1 is covered by the large-surface metal layer RSM that is electrically connected with the v-shaped through-contacts VDK, VDK1.

Figure 10:
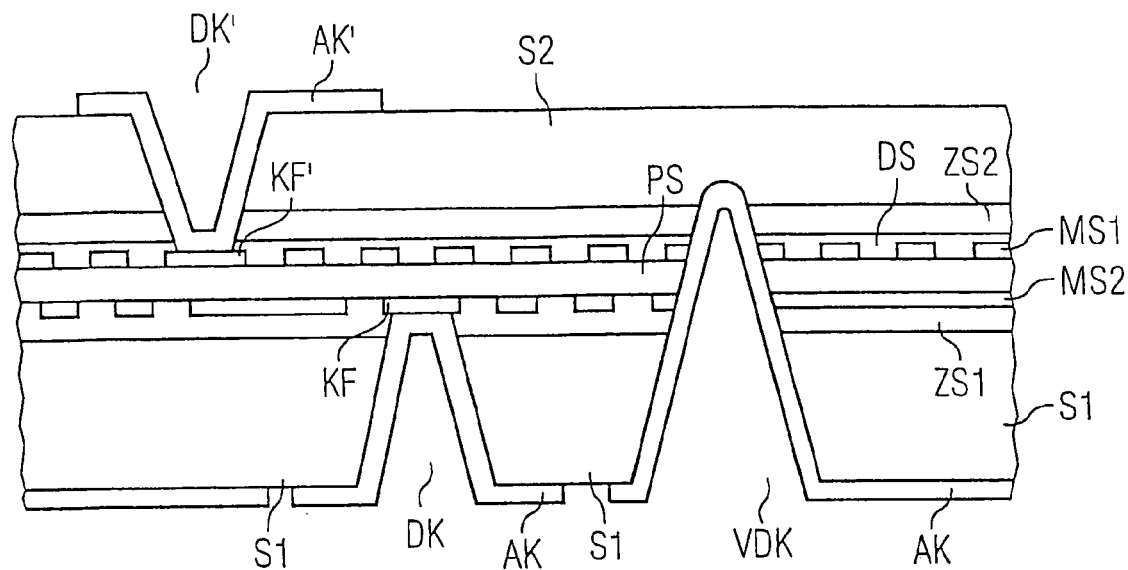
FIG. 10 is a fragmentary, diagrammatic cross-sectional view of a further component according to the invention with through-contacts provided in both substrates or with external contacts provided on the top side and the bottom side of the component.

FIG. 10 shows a portion of a further component according to the invention in a schematic cross-section. In this variant, the through-contacts DK, DK' are embodied in the first substrate S1 as well as in the second substrate S2. It is thereby possible for the contact surfaces KF, KF' to be embodied in only one of the metallization layers MS1 or MS2. A further possibility is that the contact surfaces KF' are embodied in the first metal layer MS1 and that the contact surfaces KF are embodied in the second metal layer MS2.

The provision of the external contacts on two opposite surfaces of the component has the advantage that such a component can simply be integrated as a partial module of a modularly constructed component in a perpendicular direction.

In the variant of the invention schematically illustrated in FIG. 10, both metal layers MS1 and MS2 are structured and each have electrodes and contact surfaces. The second metal layer MS2 is structured according to FIG. 5, for example.

In a variant of the invention, the first functional intermediate layer can include a (electrically or magnetically) tunable layer that has a thickness that, preferably, falls below the value of $\lambda/2$. Preferably, the layer is of a material that has a Giant-Delta-E effect (i.e., large changes of the elasticity module E that exceed 5%, for example) when mechanical bracings are present. Due to the fact that the tunable layer preferably borders against the piezo-electric layer PS, the change of the elastic characteristics also influences the acoustic characteristics of the piezo-electric layer PS or the expansion speed of the bulk wave guided in the layer system SS, respectively (and, thus, the frequency position of the component).

In the tunable layer that has magneto-resistive characteristics, the mechanical bracings can be caused by an external magnetic field.

Figure 11:
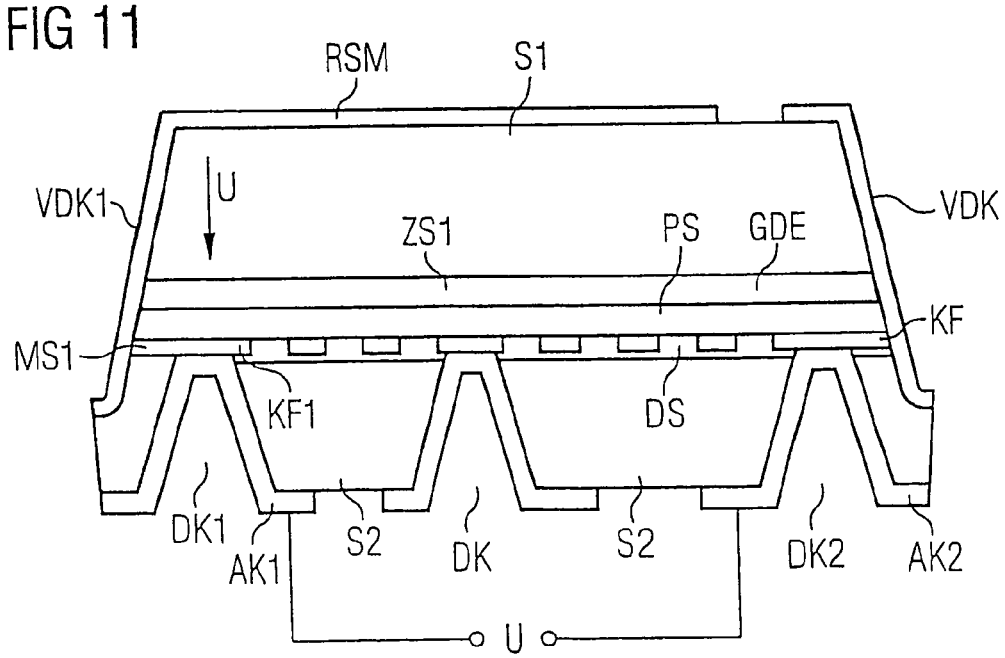
FIG. 11 is a fragmentary, diagrammatic cross-sectional view of a further component according to the invention with a magnetically tunable layer.

A further possibility for generating bracings in the tunable layer GDE lies in mechanically coupling or fixedly connecting this layer with a piezo-electric control layer that, contrary to the piezo-electric layer PS, does not serve the purpose of guiding the GBAW, but mainly for introducing a mechanical stress into the tunable layer. The mechanical stress in the piezo-electric control layer can be caused by applying a control voltage. The electrically conducting tunable layer GDE can serve as a first electrode, as shown in schematically illustrate component FIG. 11, for example, in the, and the large-surface metal layer RSM can serve as a second electrode, to which the control voltage U is applied for the purpose of electrically controlling the piezo-electric control layer.

The elasticity module E* of the tunable layer GDE can be changed to a large extent (for example, under the influence of an external magnetic field or a mechanical bracing). On one hand, the layer GDE is electrically connected with a v-shaped through-contact VDK and is connected with the external contact AK2 of the component through this through-contact and the contact surface KF and the through-contact DK2.

The large-surface metal layer RSM is disposed on the exposed surface of the first substrate S1 and is electrically connected with the v-shaped through-contact VDK1 and is further connected, through the through-contact VDK1, with the external contact AK1 through the contact surface KF1 and/or through-contact DK1. Due to the fact that the tunable layer GDE mainly is of an electrically conducting material, the embodiment of the second metal layer is not necessary, whereby the tunable layer GDE, itself, serves as an electrode of the second metal layer.

In this variant of the present invention, preferably the substrate S1 is of a piezo-electric material and forms the piezo-electric control layer. It is also possible to embody the piezo-electric control layer as a component of the first intermediate layer ZS1 and to thereby dispose the piezo-electric control layer between the tunable layer GDE and the first substrate S1.

An electric control voltage U is applied externally between the external contacts AK1 and AK2 for the purpose of tuning the frequency of the component. The control voltage U generates an electrical field between the regions of the large-surface metal layer RSM and the conductive, tunable layer GDE disposed opposite one another. The electrical field causes expansions and compressions of the material in the volume of the piezo-electric control layer located therebetween (which corresponds to the first substrate S1 in FIG. 11) and, thus, serves for mechanically controlling the elasticity module of the tunable layer GDE.

Preferably, the thickness of the piezo-electric control layer has the same or a larger thickness than the thickness of the tunable layer GDE (due to optimal transmission of the mechanical bracing on the tunable layer GDE).

The respective functional intermediate layer ZS1, ZS2 can include a plurality of functional layers that each fulfill one or a plurality of functions in the component.

FIG. 12A is a schematic top view of an electroacoustic resonator RE that can be used in a component according to the invention. The resonator includes a transducer WA, end-positioned reflectors RF1' and RF2', and auxiliary structures RF1 and RF2 disposed in the acoustic path between the transducer WA and the respective end-positioned reflector RF1' or RF2'. The auxiliary structures RF1 and RF2 are embodied as transducers and are electrically connected with the trimming structures TR or TR2, respectively. The trimming structures TR, TR2 that are embodied as interdigital transducers, each operate as a trimming capacitance, whereby a high capacitance value is made possible with the interdigital finger configuration.

The configuration illustrated in FIG. 12A is applied on the piezo-electric layer PS. The guided bulk acoustic wave is excited in the transducer WA between the electrodes E1 and E1'. The transducer WA is disposed between a second transducer RF1 and a third transducer RF2. The component structure formed in this manner is bilaterally surrounded by the reflectors RF1', RF2'. The second transducer RF1 is electrically connected with the trimming structure TR1, whereby the trimming structure TR is spaced apart from the transducer configuration. The third transducer RF2 is analogously connected with the trimming structure TR2. The trimming structures TR, TR2 are each embodied as transducers and each form a large capacitance for the transducer RF1 or RF2, respectively, thus forming an electrical load. The change of the trimming structures causes the change of the capacitance of the trimming structure, whereby a part of the electrode fingers of the trimming structures is separated. This also causes a change of the reflection conditions for the guided bulk acoustic wave in the resonator RE.

FIG. 12B is a schematic cross-section of a component according to the invention with the trimming structure TR2 according to FIG. 12A. The trimming structure TR2 is exposed through the second substrate S2. It is, thus, possible to trim the components according to the invention on the wafer plane. A portion of the electrode fingers of the trimming structure TR2 is thereby separated from the rest of the trimming structure with a laser, for example. After the trimming, the trimming structure TR2 is, preferably, sealed.

In an advantageous variant, the corresponding substrate (for the laser beam) is chosen to be transparent so that the exposure of the trimming structure TR2 is generally not necessary.

FIG. 13 shows a further variant of the component according to the invention that contains a plurality of function regions Z1, Z2 that are electrically connected to one another. The functional regions to be shielded from one another can each include a transmission path or receiving path of a duplexer circuit, for example. In one exemplary embodiment, a receiving filter RXF is disposed in the first functional region Z1 and a transmission filter TXF is disposed in the second functional region Z2. The first functional region Z1 is separated or electroacoustically decoupled from the second functional region Z2 by a v-shaped through-contact VDK. Preferably, the large-surface metallization RSM that is electrically connected with the v-shaped through-contact VDK is electrically connected with a reference potential. With the metallization of the v-shaped through-contact VDK, the functional regions Z1 and Z2 of the layer system SS are, on one hand, hermetically sealed at the corresponding cutting edges and, on the other hand, shielded from one another.

In a variant of the present invention, two transducers disposed next to one another (for example, in wave expansion direction) can be coupled by the GBAW, whereby one of the transducers, for example, serves as input transducer for coupling the signal and its conversion into the acoustic wave and the other transducer serves as output transducer for converting the acoustic wave into an electrical signal.

Groups of the electrode structures can form Single Phase Unidirectional Transducer (SPUDT) cells that cause a directed deflection of the GBAW, preferably, in one direction. The piezo-electric layer PS can also have Natural Single Phase Unidirectional Transducer (NSPUDT) characteristics, whereby, due to the natural crystal characteristics of the piezo-electric layer, the directed deflection of the GBAW takes place in the transducer.

The idea on which the invention is based can be used, for example, for realizing known reactance filters, double mode filters, filters on the basis of SPUDT, or multi-port resonators, fan-filters, duplexers, or diplexers. The components according to the invention can be used in communication technology (for example, mobile radio) and be configured particularly for PCS and UMTS mobile radio standards.

Even though it was only possible to describe a limited number of possible embodiments of the invention in the exemplary embodiment, the invention is not limited to these embodiments. It is possible to produce electroacoustically active structures, such as, for example, any number of transducers and reflectors in any shape, to change the characteristics of the filter as desired. A filter according to the invention is also not limited to the indicated materials, to the number of illustrated bores, or to certain frequency regions.

We claim:

1. An electroacoustic component, comprising:
   a first substrate;
   a layer system disposed at said first substrate to define a first interface therebetween, said layer system having:
      a piezo-electric layer;
      a first metal layer disposed on said piezo-electric layer, said first metal layer having electrode structures and contact surfaces, said electrode structures being disposed next to one another and forming a functional unit;
      a region of said piezo-electric layer disposed adjacent said functional unit forming an active region in which a guided bulk acoustic wave of a wavelength $\lambda$ can propagate; and
      a dielectric planarizing layer; and
   a second substrate;
   said piezo-electric layer being disposed between said first substrate and said first metal layer;
   said first metal layer being disposed between said piezo-electric layer and said dielectric planarizing layer; and
   said dielectric planarizing layer being disposed between said first metal layer and said second substrate;
   said layer system and said second substrate defining a second interface therebetween;
   said piezo-electric layer and said first and second substrates being formed to have a smaller propagation velocity of said guided bulk acoustic wave in said piezo-electric layer than a propagation velocity of said guided bulk acoustic wave in said first and second substrates; and
   said layer system and said first and second interfaces being devoid of cavities;
   said first substrate has a first side;
   said second substrate has a second side;
   external contacts are disposed on at least one of said first side and said second side;
   through-contacts electrically conductively connect said contact surfaces with said external contacts through at least one of said first and second substrates;
   at least two of said through-contacts in a respective one of said first and second substrates:
      extend in a V-shaped cross-section perpendicular to a respective plane of one of said first and second substrates;
      cut through corresponding ones of said contact surfaces; and
      end above an interface of a respective other one of said first and second substrates facing said respective one of said first and second substrates; and
   said V-shaped through-contacts are trench-shaped and extend along a length thereof.

2. The component according to claim 1, wherein said electrode structures are disposed in a periodic pattern with each of the electrode structures being equally spaced from each other of the electrode structures.

3. The component according to claim 1, wherein said piezo-electric layer has a thickness of between approximately $0.1\lambda$ and approximately $\lambda$.

4. The component according to claim 1, wherein a total thickness of said layer system is between $\lambda$ and $2\lambda$.

5. The component according to claim 1, further comprising:
   a second metal layer between said first substrate and said piezo-electric layer, said second metal layer having an electrode continuously disposed adjacent said active region; and said electrode structures and said electrode of said second metal layer exciting said guided bulk acoustic wave perpendicular to said piezo-electric layer.

6. The component according to claim 1, wherein a thickness of said second substrate is between approximately 2λ and approximately 5λ.

7. The component according to claim 1, wherein a thickness of said first substrate is between approximately 2λ and approximately 5λ.

8. The component according to claim 1, further comprising a functional intermediate layer between said second substrate and said planarizing layer.

9. The component according to claim 1, wherein:
said first substrate has a bottom side;
said second substrate has a top side;
external contacts are disposed on at least one of said bottom side of said first substrate and said top side of said second substrate; and
through-contacts electrically conductively connect said contact surfaces with said external contacts through at least one of said first and second substrates.

10. The component according to claim 1, wherein at least one of said through-contacts in said first substrate is connected through a corresponding one of said contact surfaces to at least one of said through-contacts in said second substrate.

11. The component according to claim 1, wherein said planarizing layer is of silicon oxide.

12. The component according to claim 1, wherein said piezo-electric layer is of a compound selected from one of the group consisting of ZnO, AlN, LiNiO$_3$, and LiTaO$_3$.

13. The component according to claim 1, wherein at least one of said first and second substrates are of a material selected from at least one of the group consisting of glass, semiconductor, silicon, and piezo-electric.

14. The component according to claim 1, wherein said electrode structures of said first metal layer form at least one of an electroacoustic transducer and a resonator.

15. The component according to claim 14, further comprising:
a second metal layer between said first substrate and said piezo-electric layer, said second metal layer having an electrode continuously disposed adjacent said active region;
said electrode structures and said electrode of said second metal layer exciting said guided bulk acoustic wave perpendicular to said piezo-electric layer;
at least one of said first and second metal layers having a trimming region therewithin;
a number ≧1 of trimming structures being capacitively coupled with said at least one of said electroacoustic transducer and said resonator and being embodied in said trimming region; and
at least one of:
said trimming region being exposed through at least one of said first and second substrates; and
said trimming region being accessible to a laser beam through at least one of said first and second substrates.

16. The component according to claim 1, wherein:
said first substrate has a bottom side;
said second substrate has a top side;
the component further comprises a large-surface metal layer disposed on at least one of said top side and said bottom side; and
said V-shaped through-contacts:
are disposed in said large-surface metal layer; and
electrically connect said large-surface metal layer with said contact surfaces.

17. The component according to claim 16, wherein:
said large-surface metal layer is on one of said top side of said second substrate and said bottom side of said first substrate; and
said external contacts are embodied in a respective other one of said first and second substrates.

18. The component according to claim 17, wherein said large-surface metal layer is connected to ground.

19. The component according to claim 16, further comprising:
at least two functional circuits electrically connected with one another and at least partially embodied in said first metal layer, said at least two functional circuits each being embodied in one of functional zones;
at least one of said V-shaped through-contacts being electrically connected with said large-surface metal layer and with ground; and
at least two of said functional zones being at least one of electrically and acoustically decoupled from one another in a lateral plane.

20. The component according to claim 19, wherein one of said functional zones includes at least a portion of a transmission filter and another of said functional zones separated therefrom includes at least a portion of a receiving filter.

21. The component according to claim 1, wherein:
a large-surface metal layer metallizes at least one of said first and second sides; and
said V-shaped through-contacts:
are disposed in said large-surface metal layer; and
electrically connect said large-surface metal layer with said contact surfaces.

22. The component according to claim 21, wherein:
said large-surface metal layer is on one of said first and second sides; and
said external contacts are embodied in a respective other one of said first and second substrates.

23. The component according to claim 22, wherein said large-surface metal layer is connected to ground.

24. The component according to claim 21, further comprising:
at least two functional circuits electrically connected with one another and at least partially embodied in said first metal layer, said at least two functional circuits each being embodied in one of functional zones;
at least one of said V-shaped through-contacts being electrically connected with said large-surface metal layer and with ground; and
at least two of said functional zones being at least one of electrically and acoustically decoupled from one another in a lateral plane.

25. The component according to claim 24, wherein one of said functional zones includes at least a portion of a transmission filter and another of said functional zones separated therefrom includes at least a portion of a receiving filter.

26. The component according to claim 1, further comprising:
further perpendicular electrical connections; and
at least one of said first and second substrates including a semiconductor layer having in a volume thereof integrated component structures electrically connected with at least one of said contact surfaces and said external contacts through one of said through-contacts and said further perpendicular electrical connections.

27. An electroacoustic component, comprising:
a first substrate;

a layer system disposed at said first substrate to define a first interface therebetween, said layer system having:
a piezo-electric layer;
a first metal layer disposed on said piezo-electric layer, said first metal layer having electrode structures and contact surfaces, said electrode structures being disposed next to one another and forming a functional unit;
a region of said piezo-electric layer disposed adjacent said functional unit forming an active region in which a guided bulk acoustic wave of a wavelength λ can propagate; and
a dielectric planarizing layer;
a second substrate;
a first functional intermediate layer between said first substrate and said piezo-electric layer; and
a second functional intermediate layer between said second substrate and said planarizing layer;
said piezo-electric layer being disposed between said first substrate and said first metal layer;
said first metal layer being disposed between said piezo-electric layer and said dielectric planarizing layer;
said dielectric planarizing layer being disposed between said first metal layer and said second substrate;
said layer system and said second substrate defining a second interface therebetween;
said piezo-electric layer and said first and second substrates being formed to have a smaller propagation velocity of said guided bulk acoustic wave in said piezo-electric layer than a propagation velocity of said guided bulk acoustic wave in said first and second substrates;
said layer system and said first and second interfaces being devoid of cavities;
wherein at least one of said first and second intermediate layers is of $SiO_x$, where $1.9<x<2.1$; and
said $SiO_x$ layer has an index of refraction of between approximately 1.43 and approximately 1.49.

28. An electroacoustic component, comprising:
a first substrate;
a layer system disposed at said first substrate to define a first interface therebetween, said layer system having:
a piezo-electric layer;
a first metal layer disposed on said piezo-electric layer, said first metal layer having electrode structures and contact surfaces, said electrode structures being disposed next to one another and forming a functional unit;
a region of said piezo-electric layer disposed adjacent said functional unit forming an active region in which a guided bulk acoustic wave of a wavelength λ can propagate; and
a dielectric planarizing layer;
a second substrate;
a second metal layer between said first substrate and said piezo-electric layer, said second metal layer having an electrode disposed below said active region in a continuous manner with respect to said active region; and
said piezo-electric layer being disposed between said first substrate and said first metal layer;
said first metal layer being disposed between said piezo-electric layer and said dielectric planarizing layer;
said dielectric planarizing layer being disposed between said first metal layer and said second substrate;
said layer system and said second substrate defining a second interface therebetween;

said piezo-electric layer and said first and second substrates being formed to have a smaller propagation velocity of said guided bulk acoustic wave in said piezo-electric layer than a propagation velocity of said guided bulk acoustic wave in said first and second substrates;
said electrode structures and said electrode of said second metal layer exciting said guided bulk acoustic wave perpendicular to said piezo-electric layer; and
said layer system and said first and second interfaces being devoid of cavities, and wherein metal structures are embodied outside of said active region in said second metal layer to increase roughness of an interface to said piezo-electric layer.

29. The component according to claim 28, wherein metal structures are embodied outside of regions in said second metal layer disposed adjacent said active region to increase roughness of an interface to said piezo-electric layer.

30. An electroacoustic component, comprising:
a first substrate;
a layer system disposed at said first substrate to define a first interface therebetween, said layer system having:
a piezo-electric layer;
a first metal layer disposed on said piezo-electric layer, said first metal layer having electrode structures and contact surfaces, said electrode structures being disposed next to one another and forming a functional unit; and
a region of said piezo-electric layer disposed adjacent said functional unit forming an active region in which a guided bulk acoustic wave of a wavelength λ can propagate;
a dielectric planarizing layer; and
a second substrate;
said piezo-electric layer being disposed between said first substrate and said first metal layer;
said first metal layer being disposed between said piezo-electric layer and said dielectric planarizing layer;
said dielectric planarizing layer being disposed between said first metal layer and said second substrate;
said layer system and said second substrate defining a second interface therebetween;
said piezo-electric layer and said first and second substrates being formed to have a smaller propagation velocity of said guided bulk acoustic wave in said piezo-electric layer than a propagation velocity of said guided bulk acoustic wave in said first and second substrates; and
said layer system and said first and second interfaces being devoid of cavities, and wherein an interface surface of a layer disposed adjacent said piezo-electric layer is roughened outside of regions disposed adjacent said active region.

31. The component according to claim 30, wherein an upper interface of a layer disposed directly below said piezo-electric layer is roughened outside of regions that are disposed directly below said active region.

32. The component according to claim 31, wherein said upper interface of said layer disposed directly below said piezo-electric layer is roughened only:
in regions directly below said contact surfaces; or
in supply lines embodied in said first metal layer.

33. The component according to claim 30, wherein said interface surface of said layer disposed adjacent said piezo-electric layer is roughened only:
in regions directly adjacent said contact surfaces; or
in supply lines embodied in said first metal layer.

34. An electroacoustic component, comprising:

a first substrate;

a layer system disposed at said first substrate to define a first interface therebetween, said layer system having:
- a piezo-electric layer;
- a first metal layer disposed on said piezo-electric layer, said first metal layer having electrode structures and contact surfaces, said electrode structures being disposed next to one another and forming a functional unit;
- a region of said piezo-electric layer disposed adjacent said functional unit forming an active region in which a guided bulk acoustic wave of a wavelength $\lambda$ can propagate; and
- a dielectric planarizing layer; and a second substrate;

said piezo-electric layer being disposed between said first substrate and said first metal layer;

said first metal layer being disposed between said piezo-electric layer and said dielectric planarizing layer; and said dielectric planarizing layer being disposed between said first metal layer and said second substrate;

said layer system and said second substrate defining a second interface therebetween;

said piezo-electric layer and said first and second substrates being formed to have a smaller propagation velocity of said guided bulk acoustic wave in said piezo-electric layer than a propagation velocity of said guided bulk acoustic wave in said first and second substrates; and said layer system and said first and second interfaces being devoid of cavities, wherein at least one of said piezo-electric layer, said first metal layer, and said dielectric planarizing layer of said layer system is to be externally accessed by a laser beam and changed by the laser beam.

35. An electroacoustic component, comprising:

a first substrate;

a layer system disposed at said first substrate to define a first interface therebetween, said layer system having:
- a piezo-electric layer;
- a first metal layer disposed on said piezo-electric layer, said first metal layer having electrode structures and contact surfaces, said electrode structures being disposed next to one another and forming a functional unit;
- a region of said piezo-electric layer disposed adjacent said functional unit forming an active region in which a guided bulk acoustic wave of a wavelength $\lambda$ can propagate; and
- a dielectric planarizing layer; and a second substrate;

said piezo-electric layer being disposed between said first substrate and said first metal layer;

said first metal layer being disposed between said piezo-electric layer and said dielectric planarizing layer;

said dielectric planarizing layer being disposed between said first metal layer and said second substrate;

said layer system and said second substrate defining a second interface therebetween;

said piezo-electric layer and said first and second substrates being formed to have a smaller propagation velocity of said guided bulk acoustic wave in said piezo-electric layer than a propagation velocity of said guided bulk acoustic wave in said first and second substrates;

said layer system and said first and second interfaces being devoid of cavities;

said first substrate has a bottom side;

said second substrate has a top side;

external contacts are disposed on at least one of said bottom side of said first substrate and said top side of said second substrate;

through-contacts electrically conductively connect said contact surfaces with said external contacts through at least one of said first and second substrates;

further perpendicular electrical connections; and at least one of said first and second substrates including a semiconductor layer having in a volume thereof integrated component structures electrically connected with at least one of said contact surfaces and said external contacts through one of said through-contacts and said further perpendicular electrical connections.

* * * * *